(12) United States Patent
Yan et al.

(10) Patent No.: US 11,393,966 B2
(45) Date of Patent: Jul. 19, 2022

(54) OMNIDIRECTIONAL LED LIGHT WIRE AND PACKAGING METHOD THEREOF, LIGHT SOURCE AND LAMP

(71) Applicant: Hangzhou Hangke Optoelectronics Co., Ltd., Hangzhou (CN)

(72) Inventors: Qianjun Yan, Hangzhou (CN); Zhaozhang Zheng, Hangzhou (CN); Lingli Ma, Hangzhou (CN)

(73) Assignee: Hangzhou Hangke Optoelectronics Co., Ltd., Hangzhou (CN)

( * ) Notice: Subject to any disclaimer, the term of this patent is extended or adjusted under 35 U.S.C. 154(b) by 0 days.

(21) Appl. No.: 17/133,224

(22) Filed: Dec. 23, 2020

(65) Prior Publication Data
US 2022/0158050 A1    May 19, 2022

(30) Foreign Application Priority Data

Nov. 14, 2020  (CN) .......................... 202011273622.3
Nov. 14, 2020  (CN) .......................... 202022630509.8

(51) Int. Cl.
| | |
|---|---|
| *H01L 33/62* | (2010.01) |
| *H01L 25/075* | (2006.01) |
| *H01L 33/50* | (2010.01) |
| *H01L 23/538* | (2006.01) |
| *F21K 9/237* | (2016.01) |
| *F21K 9/232* | (2016.01) |
| *F21Y 107/50* | (2016.01) |
| *F21V 29/50* | (2015.01) |

(52) U.S. Cl.
CPC ............. *H01L 33/62* (2013.01); *F21K 9/232* (2016.08); *F21K 9/237* (2016.08); *H01L 23/5387* (2013.01); *H01L 25/0753* (2013.01); *H01L 33/502* (2013.01); *F21V 29/50* (2015.01); *F21Y 2107/50* (2016.08); *H01L 2933/0066* (2013.01)

(58) Field of Classification Search
CPC ................................. F21K 9/278; F21K 9/232
See application file for complete search history.

(56) References Cited

U.S. PATENT DOCUMENTS

| | | | | |
|---|---|---|---|---|
| 2011/0163683 | A1* | 7/2011 | Steele | ................ F21V 19/0025 |
| | | | | 315/192 |
| 2015/0070871 | A1* | 3/2015 | Chen | ...................... F21K 9/232 |
| | | | | 362/84 |
| 2016/0363267 | A1* | 12/2016 | Jiang | ........................ F21V 29/70 |
| 2017/0012177 | A1* | 1/2017 | Trottier | ..................... F21K 9/00 |
| 2017/0084809 | A1* | 3/2017 | Jiang | ........................ H01L 33/56 |
| 2017/0227169 | A1* | 8/2017 | Jiang | ........................ F21V 3/02 |
| 2017/0336038 | A1* | 11/2017 | Kim | ....................... H01L 33/507 |

* cited by examiner

*Primary Examiner* — Andrew J Coughlin
(74) *Attorney, Agent, or Firm* — Schwegman Lundberg & Woessner, P.A.

(57) ABSTRACT

An omnidirectional LED light wire and a packaging method thereof, a light source and a lamp, and in particular, to the technical field of LED lighting. The omnidirectional LED light wire includes one or more than one flip chip and two or more than two conductive components. The one or more than one flip chip is connected through the conductive components to realize an electrical connection relationship, in single, in series, parallel or a combination of series and parallel, of the one or more than one flip chip. In view of technical problems of low efficacy, low temperature resistance and poor heat dissipation of the existing FPC substrate, the disclosure breaks bottlenecks of temperature resistance and dissipation of the FPC substrate.

20 Claims, 4 Drawing Sheets

OMNIDIRECTIONAL LED LIGHT WIRE AND PACKAGING METHOD THEREOF, LIGHT SOURCE AND LAMP

CROSS-REFERENCE TO RELATED APPLICATIONS

This Non-provisional application claims priority under 35 U.S.C. § 119(a) to Chinese Patent Application No. 202011273622.3 filed on Nov. 14, 2020, and to Chinese Patent Application No. 202022630509.8 filed on Nov. 14, 2020, the entire contents of which are hereby incorporated by reference in their entirety.

TECHNICAL FIELD

The disclosure relates to a technical field of LED lighting, and in particular to an omnidirectional LED light wire and a packaging method thereof, a light source and a lamp.

BACKGROUND ART

At present, a common flexible filament includes a substrate, a circuit laid on the substrate, a flip chip fixed with a solder paste, and a coated glue mixed with phosphors. The existing flexible filament often uses a FPC substrate, and this kind of flexible filament has a low efficacy, a low temperature resistance, a poor heat dissipation and a short service life.

SUMMARY

1. Problems to be Solved

In view of technical problems of low efficacy, low temperature resistance and poor heat dissipation of the existing FPC substrate, the disclosure provides an omnidirectional LED light wire and a packaging method thereof, a light source and a lamp, which have advantages of high efficacy, high temperature resistance and long service life, and break bottlenecks of temperature resistance and heat dissipation of the FPC substrate.

2. Solution

To solve the above problems, technical schemes provided in the disclosure is as follows:

An omnidirectional LED light wire includes one or more than one flip chips and two or more than two conductive components, the one or more than one flip chips is connected through the two or more than two conductive components to realize an electrical connection relationship, in single, in series, in parallel or in a combination of series and parallel, of the one or more than one flip chips.

Optionally, pads of the one or more than one flip chips connected in single, in series, parallel or a combination of series and parallel may be connected by the conductive components.

Optionally, the conductive components may be of a metal material.

Optionally, the conductive components may be arranged between different flip chips, or the conductive components may be arranged on both sides of the one or more than one flip chips.

Optionally, a recess of the two or more than two conductive components may be connected to a pad of the one or more than one flip chips.

Optionally, the two or more than two conductive components may be provided with one or more through holes.

Optionally, flip chips at both ends of the omnidirectional LED light wire may be respectively connected with a conductive terminal through one or more than one of the conductive components.

Optionally, further comprising a protective layer, wherein the one or more than one flip chips may be covered by the protective layer;
each conductive component connected with the one or more than one flip chips may be partially or entirely covered by the protective layer; and
the protective layer may be transparent, translucent or opaque.

Optionally, each conductive component may be in a sheet shape or wire-shaped.

Optionally, the protective layer includes or not includes a phosphor.

Optionally, the phosphor may be made of one or more of silicate, nitride, fluoride or YAG.

An omnidirectional LED light source includes one or more than one omnidirectional LED light wires described in any one of the above and connected to operate in a monodirectional DC manner or a bidirectional AC manner.

Optionally, the one or more than one omnidirectional LED light wires may be located inside a transparent, translucent or opaque protective sleeve.

Optionally, the protective sleeve may be with or without a phosphor.

Optionally, a material of the phosphor may be one or a combination of more than one of silicate, nitride, fluoride or YAG.

A packaging method of the omnidirectional LED light wire according to any one of the above, including: fixing one or more than one flip chips on an auxiliary piece; electrically connecting the one or more than one flip chips in single or in series or in parallel or in combination of series and parallel through two or more than two conductive components; covering a transparent, translucent or opaque first protective layer on a side of the one or more than one flip chips; drying; removing the auxiliary piece; covering a transparent, translucent or opaque second protective layer on another side of the one or more than one flip chips; and drying.

Optionally, flip chips may be connected in single or in series or in parallel or in combination of series and parallel by one or more than one of the conductive components using one or a combination of more than one of solder paste process, eutectic welding, reflow soldering, ultrasonic welding, heating plate, laser welding or bonding process.

Optionally, the method further may include: connecting flip chips at both ends of the omnidirectional LED light wire, in which the flip chips connected in single or in series or in parallel or in mixed of series and parallel may be implemented, respectively with a conductive terminal through one or more than one of the conductive components.

An LED lamp includes the omnidirectional LED light sources described in any one of the above, a housing, and the LED lamp further includes a driver located inside or outside the housing, wherein the conductive terminal of one or more than one omnidirectional LED light wire of the omnidirectional LED light source are connected with the driver; and the housing is filled with liquid or gaseous heat conducting substance.

Optionally, stem may be further provided inside the housing, and the omnidirectional LED light source may be fixed at the stem.

Optionally, the housing may be of glass or plastic.

Optionally, inner surface or an outer surface of the housing may be provided with a light reflecting layer.

3. Beneficial Effects

Compared with the prior art, the technical scheme provided in the disclosure has the following beneficial effects:

When the flip chip is connected, the auxiliary piece auxiliary fixes and supports the flip chip. After the electrical connection relationship, in single or in series or in parallel or in combination of series and parallel, of the flip chips is set and determined, the auxiliary piece is removed. In this way, the light wire presents advantages of high temperature resistance, good heat dissipation, high efficacy and long service life, and can adapt to various style design requirements.

DETAILED DESCRIPTION

Figure 1:
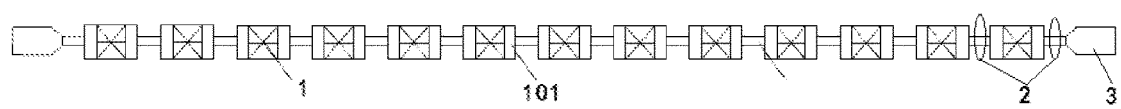
FIG. 1 is a schematic diagram of an omnidirectional LED light wire with a series structure, according to an embodiment of the present disclosure.
Figure 2:
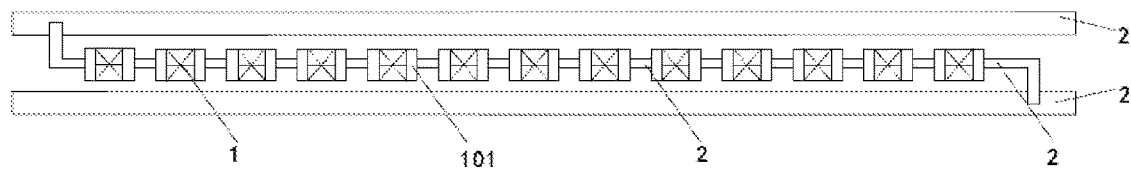
FIG. 2 is a schematic diagram of an omnidirectional LED light wire with another series structure, according to an embodiment of the present disclosure.

In order to further understand contents of the present disclosure, the present disclosure will be described in detail with reference to drawings and examples. It can be understood that the specific embodiments described herein are only intended to explain related inventions, but not to limit the invention. In addition, it should also be noted that for convenience of description, only the parts related to the invention are shown in the drawings. Terms such as "first" and "second" mentioned in the present invention are provided for the convenience of describing the technical scheme of the present invention, have no specific limiting function, are all general terms and do not constitute a limiting for the technical scheme of the present invention. It should be noted that the embodiments in the present application and the characteristics in the embodiments can be combined mutually in the case of no conflict. The present invention will be described in detail with reference to drawings and in combination with embodiments.

Example 1

In a first aspect, an embodiment provides an omnidirectional LED light wire, which includes one or more than one flip chips 1 and two or more than two conductive components 2. The one or more than one flip chips 1 is connected through the two or more than two conductive components 2 to realize an electrical connection relationship, in single, in series, parallel or a combination of series and parallel, of the one or more than one flip chips 1. As shown in FIGS. 1 to 4, the electrical connection relationships, in single, in series, parallel or a combination of series and parallel, of the one or more than one flip chips 1 are illustrated. A technical scheme in this embodiment provides low thermal resistance, small loss, high conversion efficiency, high efficacy, high temperature resistance and long service life.

When the number of flip chip 1 is one, two electrode draw-out portions of the flip chip 1 are respectively connected with one conductive component 2, so as to supply power to one flip chip 1 and cause the flip chip 1 to emit light.

When the number of flip chips 1 is two, the two flip chips 1 can be connected in series or in parallel through one or more than one of the conductive components 2. When the number of flip chips 1 is three or more, the three or more flip chips can be in an electrical connection relationship in series, parallel or a combination of series and parallel through one or more than one of the conductive components 2.

A material and shape of the conductive components 2, as well as a connection relationship and relative position relationship between the conductive components 2 and the flip chips 1, can be changed without limitation. It is conceivable that for the omnidirectional LED light wire according to this embodiment, above-mentioned characteristics of the conductive components 2 can be adaptively adjusted and changed in actual mass production applications in view of factors such as cost, product yield, stability and reliability.

The conductive components 2 is of a metal material which can be any one of gold, silver, copper, alloy, conductive plastic, conductive rubber or the like and be not limited to examples in this embodiment. A recess 22 of the two or more than two conductive components are connected to a pad of the one or more than one flip chips. The recess 22 can be processed by etching, laser machining or other processing, and the recess can be in round, square or other shapes, which can be selected and determined with considering various factors such as convenience and cost of an actual packaging process, and be not limited by this embodiment.

The conductive components 2 is provided with one or more than one through holes to improve a light transmittance of the light wire. An electrical connection relationship, in single, series, parallel or a combination of series and parallel, of a plurality of flip chips 1 constituting the light wire is realized through the conductive components 2. When the light wire emits light, the conductive components 2 shield part of the light of the flip chips 1 and affect its lighting effect. In order to further improve the transmittance of the light wire, one or more than one through holes is provided in the conductive components 2 without affecting a good and reliable conductive property of the conductive components 2, so that the light emitted by the flip chips 1 can spread out through the through hole, thereby improving the overall light transmittance of the light. A size, shape and position of the through hole provided in the conductive components 2 are not limited, and can be comprehensively determined according to requirements and other factors in the actual machining process without affecting the good and reliable conductive property of the conductive components 2.

Pads 101 of the flip chips 1 in single, series, parallel or a combination of series and parallel are connected by the conductive components 2, as shown in FIG. 1, so as to realize an electrical connection relationship, in single, series, parallel or a combination of series and parallel, of the one or more than one flip chips 1.

The conductive components 2 are provided between the flip chips 1, or the conductive components 2 are located on both sides of the one or more than one flip chips 1, so as to realize the electrical connection relationship, in single, series, parallel or a combination of series and parallel, of a plurality of flip chips 1. A shape of the conductive components 2 can be line-shaped or sheet-shaped. When the conductive components 2 are line-shaped, it can be used individually for the electrical connection relationship, in single, in series, parallel or a combination of series and parallel, of the plurality of flip chips 1, or can be used in combination with a sheet-shaped conductive components 2 for the electrical connection relationship, in single, series, parallel or a combination of series and parallel, of the plurality of flip chips 1. When the conductive components 2 are sheet-shaped, it can be used individually for the electrical connection relationship, in single, series, parallel or a combination of series and parallel, of the plurality of flip chips 1, or can be used in combination with the line-shape conductive components 2 for the electrical connection relationship, in single, series, parallel or a combination of series and parallel, of the plurality of flip chips 1.

The flip chips 1 at both ends of the omnidirectional LED light wire are respectively connected with a conductive terminal 3 through the conductive components 2, which facilitates connecting the omnidirectional LED light wire with a power supply to cause the omnidirectional LED light wire to emit light.

According to this embodiment, the omnidirectional LED light wire further includes a protective layer. The flip chip 1 is covered by a transparent, translucent or opaque protective layer. The conductive components 2 is partially or entirely covered by the transparent, translucent or opaque protective layer. That is, when the one or more than one flip chips 1 is connected by the conductive components 2 in the electrical connection relationship in single, series, parallel or a combination of series and parallel, the conductive components 2 is located between the flip chips 1 or at an outer side of two faces of the flip chip 1. In an embodiment, when the conductive components 2 on both sides of the flip chip 1 are covered by the transparent, translucent or opaque protective layer, the conductive components 2 on both sides of the flip chip 1 are covered by the transparent, translucent or opaque protective layer, which means that both the conductive components 2 and the flip chip 1 are covered by the transparent, translucent or opaque protective layer.

In addition, the conductive components 2 disposed on both sides of the flip chip 1 may also be located outside the transparent, translucent or opaque protective layer. That is, only the flip chip 1 and the conductive components 2 between flip chips 1 are covered by the transparent, translucent or opaque protective layer, and other conductive components 2 are located outside the transparent, translucent or opaque protective layers.

The protective layer can be of plastic, rubber, glue, silica gel or other materials and be made to be transparent, translucent or opaque, so as to protect the flip chip 1 and the conductive components 2, and to ensure a reliable connection and a good conductivity of the omnidirectional LED light wire. The protective layer is with or without a phosphor, which can be selected and determined according to process and performance requirements of different products. A material of the phosphor is one or a combination of more than one of silicate, nitride, fluoride or YAG.

The conductive components 2 are sheet or line-shaped. When the conductive components 2 are sheet-shaped, the flip chips 1 can be connected in single, series, parallel or a combination of series and parallel through the sheet-shaped conductive components 2, and the conductive components 2 can be located between the flip chips 1 or on the outer side of two faces of the flip chip 1. When the conductive components 2 are line-shaped, the flip chips 1 can be connected in single, series, parallel or a combination of series and parallel through the line-shaped conductive components 2, and the conductive components 2 can be located between the flip chips 1 or on the outer side of two faces of the flip chip 1.

In a second aspect, this embodiment provides an omnidirectional LED light source which includes one or more than one omnidirectional LED light wires described above and connected to operate in a mono-directional DC manner or a bidirectional AC manner. When it operates in the bidirectional AC manner, it can be directly operated with an AC mains power, and its brightness can also be adjusted by a common dimmer for adjusting a conduction angle, thus realizing a dimming lamp. When the at least one LED light wire is connected to operate in the mono-directional DC manner, it can be operated with a DC power supply or AC power supply; When the AC power supply is used, the driver can be composed of a current limiting circuit and a rectifying and filtering circuit with a capacitor and a resistor connected in parallel, or can be a switching power supply or a constant current device without a transformer.

The omni-directional LED light source in this embodiment can be composed of the omni-directional LED light wires emitting lights with a same color or different colors. For example, the omni-directional LED light wires can be the same omni-directional LED light wires emitting blue light or other monochromatic light; or can be the omni-directional LED light wires emitting lights with different colors.

The omnidirectional LED light wire is located in a transparent, translucent or opaque protective sleeve, and the protective sleeve can be made of glass, plastic, rubber, silica gel or other materials and be made to be transparent, translucent or opaque. The protective sleeve may be with a phosphor to present different luminous effects or may be without phosphors, which is selected and determined according to customized requirements of products. A material of the phosphor is one or a combination of more than one of silicate, nitride, fluoride or YAG.

In an embodiment, when the protective sleeve is a glass tube, if the omni-directional LED light wire emits blue light which needs to be converted into white light with phosphors, the phosphors can be mixed in a transparent medium in the glass tube for the omni-directional LED light wire or be coated on an inner wall or outer wall of the glass tube.

In a third aspect, an embodiment provides a packaging method of the omnidirectional LED light wire according to any one of the above, which includes S101 to S104.

In S101, one or more than one flip chips 1 is fixed on an auxiliary piece. Because the flip chip 1 is small in size and light in weight, the auxiliary piece can temporarily fix and support the flip chip 1.

In S102, with an electrical connection relationship, in single, series, parallel or a combination of series and parallel, of the one or more than one flip chips 1, the flip chips 1 connected in single, series, parallel or a combination of series and parallel are connected through a conductive components 2. The flip chip 1 is connected in single or in series or in parallel or in combination of series and parallel by the conductive components 2 using one or a combination of more than one of solder paste process, eutectic welding, reflow soldering, ultrasonic welding, heating plate, laser welding or Bonding process.

Figure 3:
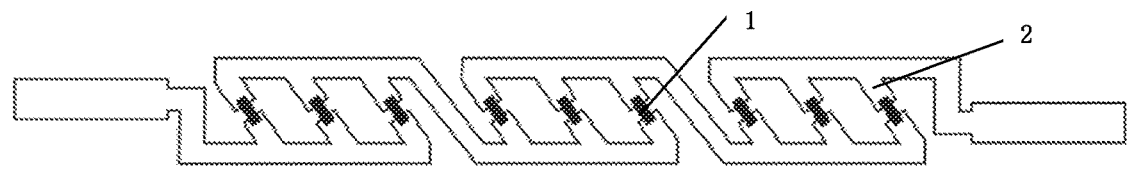
FIG. 3 is a schematic diagram of an omnidirectional LED light wire with a series-parallel electrical connection structure, according to an embodiment of the present disclosure.
Figure 4:
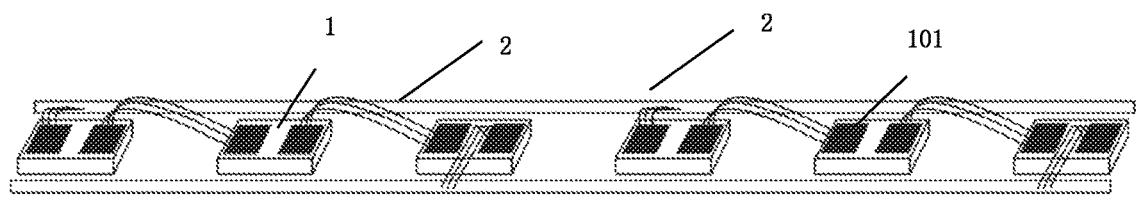
FIG. 4 is a schematic diagram of an omnidirectional LED light wire with another series-parallel electrical connection structure, according to an embodiment of the present disclosure.

When one or more than one flip chips 1 is electrically connected by using the line-shaped conductive components 2, one or more than one flip chips 1 can be electrically connected in single, series, parallel or a combination of series and parallel by wire bonding. In the related art, the wire bonding is mainly used for a face-up chip. Compared with the face-up chip, the pad of the flip chip 1 is larger, and when the electrical connection relationship is realized by the wire bonding, the pads of the flip chips 1 in the electrical connection relationship can be electrically connected by one or more metal wires (the metal wire is an implementation of the conductive components 2 in this embodiment), as shown in FIG. 3. When two or more than two metal wires are arranged by the wire bonding between the pads of flip chips 1 in the electrical connection relationship, if one of the metal wires is damaged, the electrical connection between flip chips 1 will not be affected, which can improve reliability of the electrical connection between flip chips 1 and ensure a good conductivity.

With this process step, the electrical connection relationship in single, series, parallel or a combination of series and parallel between flip chips 1 is processed and fixed. Further, for realizing the electrical connection relationship, in single or in series or in parallel or in combination of series and parallel, of one or more than one flip chips 1, the flip chips 1 at both ends of the omnidirectional LED light wire is respectively connected with a conductive terminal 3 through the conductive components 2 for a connection with a power supply.

In S103, a transparent, translucent or opaque first protective layer is covered on a side of the flip chip and then is dried; and the auxiliary piece is removed.

In S104, a transparent, translucent or opaque second protective layer is covered on another side of the flip chip and is dried.

When the flip chip 1 is connected, the auxiliary piece auxiliarily and temporarily fixes and supports the flip chip 1. After the electrical connection relationship, in single or in series or in parallel or in combination of series and parallel, of the flip chips 1 is set and determined, the auxiliary piece is removed. In this way, the light wire has a low energy consumption and high flexibility and can adapt to various style design requirements.

Figure 8:
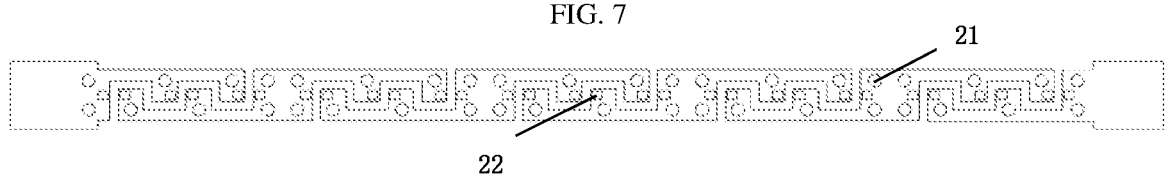
FIG. 8 is a structural schematic diagram of an omnidirectional LED light wire according to an embodiment of the present disclosure.

Through holes are defined on a surface of the conductive components 2 used in step S102. As shown in FIG. 8, the through holes 21 on the conductive components 2 can be evenly or unevenly distributed, which can be arbitrarily determined according to process requirements without affecting the good and reliable conductive property of the conductive components 2, which is not limited by examples in this embodiment. Compared with the conductive components 2 without through holes, the conductive components 2 with through holes can transmit the light emitted by the flip chip 1 through the through holes, which can improve the light transmittance of the light wire.

In a fourth aspect, the embodiment provides an LED lamp includes the omnidirectional LED light source described above, and further includes a housing, and a driver located inside or outside the housing. Conductive terminals of one or more than one omnidirectional LED light wires of the omnidirectional LED light source are connected with the driver. The housing is filled with liquid or gaseous heat conducting substance.

Figure 5:
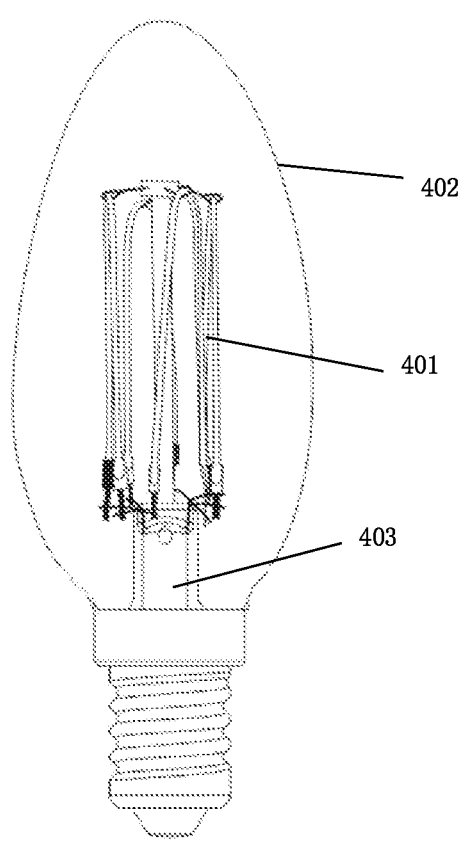
FIG. 5 is a structural schematic diagram of an LED lamp according to an embodiment of the present disclosure.
Figure 6:
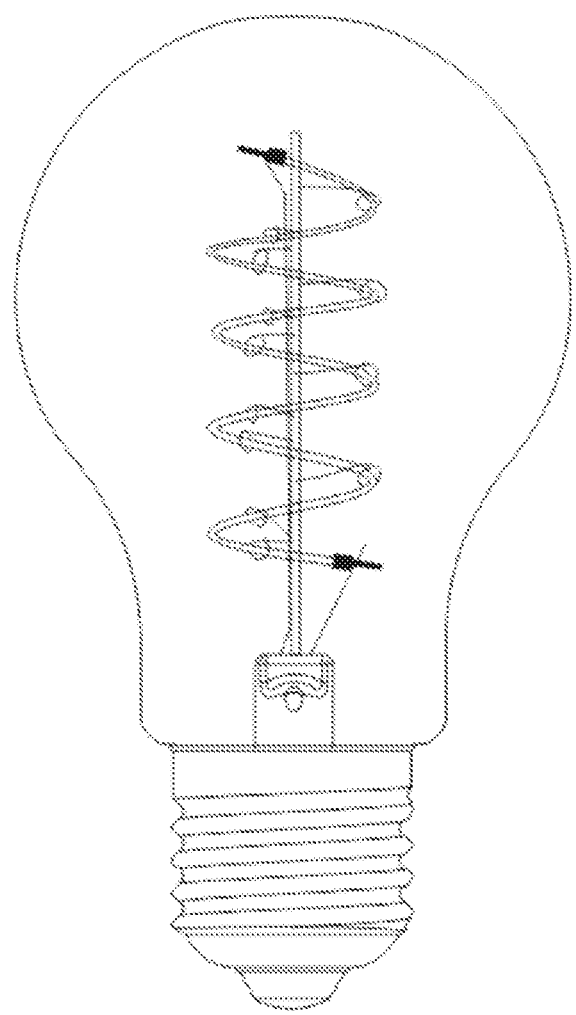
FIG. 6 is a structural schematic diagram of another LED lamp according to an embodiment of the present disclosure.
Figure 7:
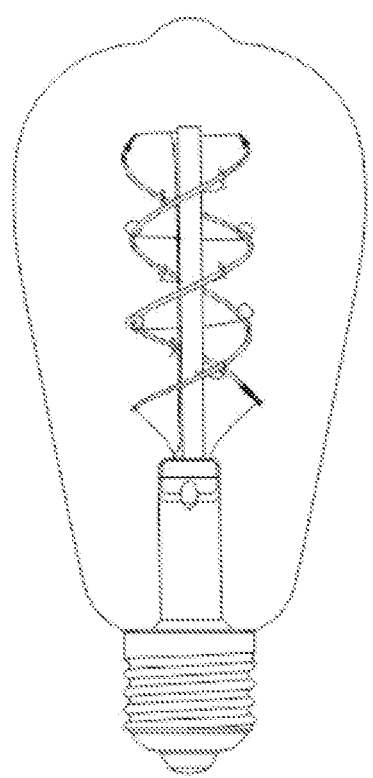
FIG. 7 is a structural schematic diagram of yet another LED lamp according to an embodiment of the present disclosure.

As another embodiment, as shown in FIGS. 5-7, a stem 403 is further provided in the housing 402, and the omnidirectional LED light source 401 is fixed on the stem 403. For example, the bulb lamp can be made, and a housing of the bulb lamp can be of glass, plastic or other material, which is not limited. As an alternative embodiment, a bulb lamp is provided which includes a housing, a stem with an exhaust pipe, an electric lead and a bracket, at least one omnidirectional LED light source, a driver and a lamp base. The light source is fixed on the stem, pins of the light source are connected with output control end of the driver through the electric lead of the stem, and the input end of the driver is connected with the lamp base. The stem and the housing are vacuum sealed to form a sealed cavity, and the sealed cavity is filled with liquid or gaseous heat conducting substances. At any position on an inner surface or outer surface of the housing of the bulb lamp may or may not be provided a reflective layer. The inner surface or outer surface of the housing of the bulb lamp can also be partially or completely coated with phosphors. A material of the phosphor is one or a combination of more than one of silicate, nitride, fluoride or YAG.

The liquid heat conducting substance can be glycerin, methyl silicone oil, dimethyl silicone oil, heat conduction oil, transformer oil, etc. The gaseous heat conduction substance can be helium, helium mixed gas, etc. In practical applications, a selection of the above-mentioned heat conduction substances is not limited by the examples in this embodiment.

The above schematic description of the present disclosure and its embodiments is not restrictive; what is shown in the drawings is only one of the embodiments of the present disclosure, and an actual structure is not limited thereto. Therefore, structures and embodiments, which are designed by those of ordinary skill in the art without creative efforts upon inspiring by this disclosure and without departing from the creative purpose of this disclosure, similar to this technical scheme fall within the protection scope of this disclosure.

What is claimed is:

1. An omnidirectional LED light wire, comprising one or more than one flip chips and two or more than two conductive components,
wherein the one or more than one flip chips is connected through the two or more than two conductive components to realize an electrical connection relationship, in single, in series, in parallel or in a combination of series and parallel, of the one or more than one flip chips;
wherein the two or more than two conductive components are provided with one or more through holes to through the light emitted by the flip chips.

2. The omnidirectional LED light wire according to claim 1, wherein pads of the one or more than one flip chips connected in single, series, parallel or a combination of series and parallel are connected by the conductive components.

3. The omnidirectional LED light wire according to claim 1, wherein the conductive components are of a metal material.

4. The omnidirectional LED light wire according to claim 1, wherein the conductive components are arranged between different flip chips and the conductive components are arranged on both sides of the one or more than one flip chips.

5. The omnidirectional LED light wire according to claim 1, wherein a recess of the two or more than two conductive components are connected to a pad of the one or more than one flip chips.

6. The omnidirectional LED light wire according to claim 1, wherein the through holes are distributed unevenly.

7. The omnidirectional LED light wire according to claim 1, wherein flip chips at both ends of the omnidirectional LED light wire are respectively connected with a conductive terminal through one or more than one of the conductive components.

8. The omnidirectional LED light wire according to claim 1, further comprising a protective layer, wherein the one or more than one flip chips is covered by the protective layer;
   each conductive component connected with the one or more than one flip chips is partially or entirely covered by the protective layer; and
   the protective layer is transparent, translucent or opaque.

9. The omnidirectional LED light wire according to claim 8, wherein each conductive component is in a sheet shape or wire-shaped; and the conductive component is in a sheet shape can be used individually, or the conductive component is in a wire-shape can be used individually, or a combination of a sheet-shaped conductive component and a wire-shaped conductive component can be used to connected the two or more than two conductive components, realizing an electrical connection relationship, in single, in series, in parallel or in a combination of series and parallel, of the one or more than one flip chips.

10. The omnidirectional LED light wire according to claim 8, wherein the protective layer comprises a phosphor, and the phosphor is made of one or a combination of more than one of silicate, nitride, fluoride or YAG.

11. An omnidirectional LED light source, comprising one or more than one omnidirectional LED light wires according to claim 1 connected to operate in a mono-directional DC manner or a bidirectional AC manner.

12. The omnidirectional LED light source according to claim 11, wherein the one or more than one omnidirectional LED light wires is located inside a transparent, translucent or opaque protective sleeve.

13. The omnidirectional LED light source according to claim 12, wherein the protective sleeve comprises a phosphor, and the phosphor is made of one or a combination of more than one of silicate, nitride, fluoride or YAG.

14. A packaging method of the omnidirectional LED light wire according to claim 1, comprising:
   fixing one or more than one flip chips on an auxiliary piece;
   electrically connecting the one or more than one flip chips in single or in series or in parallel or in combination of series and parallel through two or more than two conductive components;
   covering a transparent, translucent or opaque first protective layer on a side of the one or more than one flip chips;
   drying;
   removing the auxiliary piece;
   covering a transparent, translucent or opaque second protective layer on another side of the one or more than one flip chips; and
   drying.

15. The packaging method of the omnidirectional LED light wire according to claim 14, wherein flip chips are connected in single or in series or in parallel or in combination of series and parallel by one or more than one of the conductive components using one or a cotnbi nation of more than one of solder paste process, eutectic welding, reflow soldering, ultrasonic welding, heating plate, laser welding or bonding process.

16. The packaging method of the omnidirectional LED light wire according to claim 14, further comprising:
   connecting flip chips at both ends of the omnidirectional LED light wire, in which the flip chips connected in single or in series or in parallel or in mixed of series and parallel are implemented, respectively with a conductive terminal through one or more than one of the conductive components.

17. An LED lamp, comprising the omnidirectional LED light sources according to claim 11, a housing, and the LED lamp further comprising a driver located inside or outside the housing, wherein the conductive terminal of one or more than one omnidirectional LED light wire of the omnidirectional LED light source are connected with the driver and
   the housing is filled with liquid or gaseous heat conducting substance.

18. The LED lamp according to claim 17, wherein a stem is further provided inside the housing, and the omnidirectional LED light source is fixed at the stem.

19. The LED lamp according to claim 17, wherein the housing is of glass or plastic.

20. The LED lamp according to claim 17, wherein an inner surface or an outer surface of the housing is provided with a light reflecting layer.

\* \* \* \* \*